(12) United States Patent
Takabayashi et al.

(10) Patent No.: US 9,705,282 B2
(45) Date of Patent: Jul. 11, 2017

(54) MULTI-WAVELENGTH LASER LIGHT SOURCE AND WAVELENGTH MULTIPLEXING COMMUNICATION SYSTEM

(71) Applicant: FUJITSU LIMITED, Kawasaki-shi, Kanagawa (JP)

(72) Inventors: Kazumasa Takabayashi, Atsugi (JP); Tsuyoshi Yamamoto, Zama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/135,838

(22) Filed: Apr. 22, 2016

(65) Prior Publication Data

US 2016/0336718 A1 Nov. 17, 2016

(30) Foreign Application Priority Data

May 12, 2015 (JP) .................. 2015-097491

(51) Int. Cl.
*H01S 5/00* (2006.01)
*H01S 5/06* (2006.01)
*H01S 5/14* (2006.01)
*H01S 5/10* (2006.01)

(52) U.S. Cl.
CPC .......... *H01S 5/0612* (2013.01); *H01S 5/0078* (2013.01); *H01S 5/0085* (2013.01); *H01S 5/06* (2013.01); *H01S 5/1071* (2013.01); *H01S 5/1092* (2013.01); *H01S 5/1096* (2013.01);
(Continued)

(58) Field of Classification Search
CPC .......... H01S 5/0612; H01S 5/06; H01S 5/101; H01S 5/1032; H01S 5/1096; H01S 5/1092; H01S 5/1071; H01S 5/1007; H01S 5/0078; H01S 5/0085
See application file for complete search history.

(56) References Cited

U.S. PATENT DOCUMENTS

2004/0228564 A1* 11/2004 Gunn, III ........... G02B 6/12004
  385/1
2006/0127007 A1*  6/2006 Margalit ................. H01S 5/141
  385/39
(Continued)

FOREIGN PATENT DOCUMENTS

JP H07-029647 1/1995
JP 2008-227154 A1 9/2008
(Continued)

*Primary Examiner* — Kinam Park
(74) *Attorney, Agent, or Firm* — Kratz, Quintos & Hanson, LLP

(57) ABSTRACT

A multi-wavelength laser light source includes a gain waveguide having a gain medium and a first mirror; and a waveguide wavelength filter, wherein the waveguide wavelength filter comprises: a first optical waveguide coupled to an end of the gain waveguide opposite to the first mirror, a plurality of ring resonators having input ports coupled to the first optical waveguide and having resonance wavelengths different from each other, a plurality of output waveguides coupled to respective output ports of the plurality of ring resonators, and second mirrors configured to correspondingly reflect, back to the plurality of ring resonators, at least part of light that has traveled via the output waveguides from the plurality of ring resonators.

18 Claims, 13 Drawing Sheets

(52) U.S. Cl.
    CPC ............ *H01S 5/142* (2013.01); *H01S 5/101* (2013.01); *H01S 5/1007* (2013.01); *H01S 5/1032* (2013.01)

(56) References Cited

U.S. PATENT DOCUMENTS

| | | | |
|---|---|---|---|
| 2009/0046748 A1* | 2/2009 | Kato | ........................ H01S 5/026 372/20 |
| 2009/0122817 A1* | 5/2009 | Sato | .................... G02B 6/12007 372/20 |
| 2012/0045167 A1* | 2/2012 | Julien | ................ G02B 6/12002 385/14 |
| 2012/0243880 A1 | 9/2012 | Oda | |

FOREIGN PATENT DOCUMENTS

| | | | |
|---|---|---|---|
| JP | 2012-191075 | A1 | 10/2012 |
| JP | 2012-203264 | A1 | 10/2012 |

\* cited by examiner

MULTI-WAVELENGTH LASER LIGHT SOURCE AND WAVELENGTH MULTIPLEXING COMMUNICATION SYSTEM

CROSS-REFERENCE TO RELATED APPLICATION

This application is based upon and claims the benefit of priority of the prior Japanese Patent Application No. 2015-097491, filed on May 12, 2015, the entire contents of which are incorporated herein by reference.

FIELD

The embodiments discussed herein are related to a multi-wavelength laser light source and a wavelength multiplexing communication system using the same and, for example, to a multi-wavelength laser light source that simultaneously outputs light with multiple wavelengths used in a wavelength multiplexing optical communication system.

BACKGROUND

The optical communication system performs large-capacity optical transmission by using, as technique of increasing a transmission capacity per optical fiber, wavelength multiplexing communication technique in which multiple optical signals having different wavelengths are transmitted together in one optical fiber. In a wavelength multiplexing communication system, multiple light sources having different wavelengths are used as a laser light source. In a conventional system, since one laser light source is used for an optical signal of one wavelength, the number of laser light sources corresponds to the number of wavelengths to be used (see, for example, Japanese Laid-open Patent Publication No. 2008-227154).

A conventional wavelength multiplexing communication system will be described below with reference to FIG. 13. FIG. 13 is an outline configuration diagram of a conventional wavelength multiplexing communication system. Optical signals 1 to N (wavelengths $\lambda_1$ to $\lambda_N$) from semiconductor lasers $71_1$ to $71_N$ corresponding to the number N of wavelengths to be used are modulated by optical modulators $72_1$ to $72_N$, and are multiplexed by an optical multiplexer 73. Then, the multiplexed signal is transmitted via one optical fiber 74.

In contrast, a multi-wavelength laser light source is capable of outputting laser having multiple wavelengths by using one laser. Thus, in a wavelength multiplexing communication system, the system configuration may be simplified by reducing the number of laser light sources to be used (see, for example, Japanese Laid-open Patent Publication No. 2012-191075 or Japanese Laid-open Patent Publication No. 2012-203264).

FIG. 14 is an explanatory diagram of an example of a conventional multi-wavelength laser light source. In a multi-wavelength laser light source 80, a semiconductor optical amplifier 81 is provided between a pair of mirrors 82 and 83, and an etalon 84 is inserted between the semiconductor optical amplifier 81 and the mirror 82. Only light having a desired wavelength among the light having a wide range of wavelengths generated by the semiconductor optical amplifier 81 is selectively transmitted via the etalon 84 so as to oscillate laser light alone with the selectively transmitted wavelength.

As described above, laser light in which multiple wavelengths are mixed is output from a multi-wavelength laser light source. On the other hand, in a wavelength multiplexing communication system, optical signals of respective wavelengths are modulated independently by separate optical modulators. Therefore, in the case of a multi-wavelength laser light source, an optical splitter has to be used so that light is divided and the divided light is input to respective optical modulators on a wavelength basis.

With reference to FIG. 15, a wavelength multiplexing communication system that is usually employed when a multi-wavelength laser light source is used will be described below. FIG. 15 is an outline configuration diagram of a wavelength multiplexing communication system that is usually employed when a multi-wavelength laser light source is used. Laser light having multiple wavelengths from the multi-wavelength laser light source 80 is split by an optical splitter 75, and the split laser light is then modulated by the optical modulators $72_1$ to $72_4$ on a wavelength basis. The modulated optical signals are multiplexed by the optical multiplexer 73, and the multiplexed optical signal is transmitted via one optical fiber 74. Note that, although the case of four wavelengths is illustrated here, the system is not limited to the case of the four-wavelength multiplexing.

When a multi-wavelength laser light source is used in a wavelength multiplexing communication system, however, there is a problem that, while the use of the multi-wavelength laser light source may reduce the number of lasers, an optical splitter has to be added.

Therefore, in a multi-wavelength laser optical source and a wavelength multiplexing communication system, one of the objects is to reduce the number of components of the system and construct a wavelength multiplexing communication system with a simple configuration.

SUMMARY

According to an aspect of the embodiments, a multi-wavelength laser light source includes a gain waveguide having a gain medium and a first mirror; and a waveguide wavelength filter, wherein the waveguide wavelength filter comprises: a first optical waveguide coupled to an end of the gain waveguide opposite to the first mirror, a plurality of ring resonators having input ports coupled to the first optical waveguide and having resonance wavelengths different from each other, a plurality of output waveguides coupled to respective output ports of the plurality of ring resonators, and second mirrors configured to correspondingly reflect, back to the plurality of ring resonators, at least part of light that has traveled via the output waveguides from the plurality of ring resonators.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
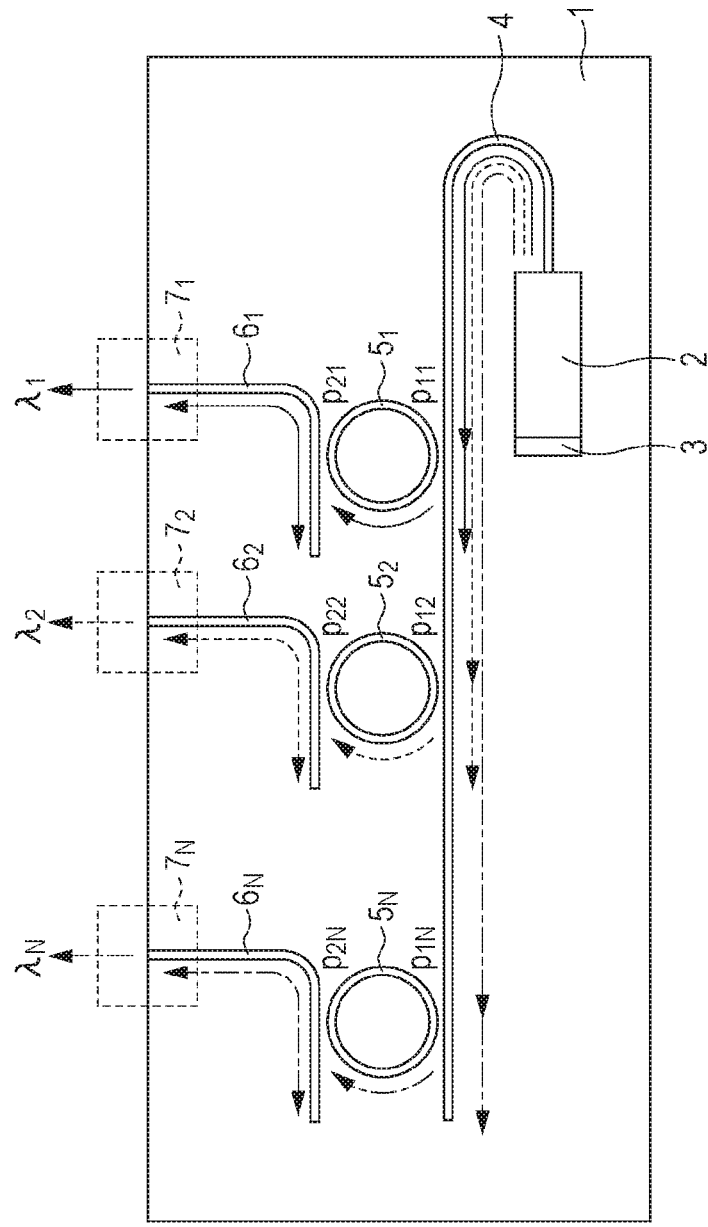
FIG. 1 is an outline configuration diagram of a multi-wavelength laser light source according to an implementation of the present disclosure.

Hereinafter, a multi-wavelength laser light source and a wavelength multiplexing communication system according to an implementation of the present disclosure will be described with reference to FIGS. 1 and 2. FIG. 1 is an outline configuration diagram of a multi-wavelength laser light source according to the implementation of the present disclosure. The multi-wavelength laser light source of the disclosure has a gain waveguide including a gain medium 2 and a first reflective mirror 3, and a waveguide wavelength filter.

The waveguide wavelength filter has a first optical waveguide 4 optically connected to the gain waveguide, ring resonators $5_1$ to $5_N$ whose input ports are connected to the first optical waveguide 4, and output waveguides $6_1$ to $6_N$ connected to respective output ports of the ring resonators $5_1$ to $5_N$. The output waveguides $6_1$ to $6_N$ have second reflective mirrors $7_1$ to $7_N$ on the emitting end side thereof. The ring resonators $5_1$ to $5_N$ are ring resonators whose resonance wavelengths are different from each other and that are for selection of multiple individual wavelengths, and at least part of light that has traveled to output waveguides $6_1$ to $6_N$ is reflected by the second reflective mirrors $7_1$ to $7_N$ back to the ring resonators $5_1$ to $5_N$. The first reflective mirror 3 and the second reflective mirrors $7_1$ to $7_N$ form a laser resonator for the gain medium.

Note that, while the second reflective mirror $7_1$ to $7_N$ may be a reflective film provided on an end face of a substrate 1, it is desirable to use distributed Bragg reflectors that may control wavelengths individually and, in particular, it is desirable that each of these distributed Bragg reflectors be provided with a wavelength adjusting mechanism such as a heater configured to adjust a reflection wavelength.

The gain medium 2 is desirably a semiconductor optical amplifier. In particular, a semiconductor optical amplifier having an active layer including quantum dots is desirable. In this case, since the quantum dots that contribute to laser oscillation at respective wavelengths operate independently due to variation in the size of the quantum dots, stable laser oscillation at many wavelengths is easily obtained.

For each optical waveguide of the waveguide wavelength filter, it is desirable to use a silicon optical waveguide that is formed by processing a single-crystal silicon layer of an SOI substrate by silicon photonics technologies. This facilitates a reduction in size.

It is desirable that the ring resonators $5_1$ to $5_N$ have a wavelength control mechanism configured to change resonance wavelengths of respective ring resonators $5_1$ to $5_N$, for example, a wavelength control mechanism such as heaters that control the resonance wavelength positions of the respective ring resonators $5_1$ to $5_N$ such that the resonance wavelength positions are different from each other. With the use of a heater, a wavelength may be changed about 1 nm for a temperature change of 10 degrees Celsius.

Further, the first optical waveguide 4 may be formed of a first sub-optical waveguide and a second sub-optical waveguide at least a part of which is arranged in parallel to the first sub-optical waveguide, and the first sub-optical waveguide and the second sub-optical waveguide may be coupled by a wavelength selecting ring resonator.

In this case, it is desirable that the wavelength selecting ring resonator be provided with a wavelength control mechanism configured to change the resonance wavelength of the wavelength selecting ring resonator such as a wavelength control mechanism configured to control the resonance wavelength position of the wavelength selecting ring resonator. Further, it is desirable that the ring resonators $5_1$ to $5_N$ be provided with a wavelength control mechanism configured to change the resonance wavelengths of respective ring resonators $5_1$ to $5_N$ such as waveguide control mechanisms configured to perform control such that resonance wavelength positions of the respective ring resonators match different resonance wavelengths of the wavelength selecting ring resonator.

Further, it is desirable that each of the output waveguides $6_1$ to $6_N$ be provided with a phase controller such as a heater for controlling the phase of a propagating laser light, and thereby a resonator length of a laser resonator formed of the first reflective mirror 3 and the second reflective mirrors $7_1$ to $7_N$ may be controlled in accordance with a wavelength. Note that each control mechanism is not limited to a heater. Some mechanism configured to adjust the temperature of the entire substrate by using a Peltier effect element or the like may be mounted. In this case, by controlling the temperature of the entire substrate 1 at a predetermined temperature from the backside thereof, a selected wavelength may be entirely shifted without causing a change of a matching relationship among the resonance wavelengths of the ring resonators. Therefore, easier fine tune of the wavelength becomes possible without controlling currents of individual heaters.

Further, an optical modulator may be connected to each of the output waveguides $6_1$ to $6_N$. The optical modulator in this case is desirably integrated with the waveguide wavelength filter in a monolithic manner by silicon photonics technologies. A typical optical modulator may be an electro absorption optical modulator or a Mach-Zehnder optical modulator.

When a wavelength selecting ring resonator is used, each of the output waveguides $6_1$ to $6_N$ may be connected to one end port of an optical coupler such as a directional coupler, a multimode interference waveguide, or the like, and a loop mirror as the second reflective mirror may be connected to the other end port of the optical coupler. In this case, the optical modulator may be connected via a branching waveguide connected to the one end port of the optical coupler.

Figure 2:
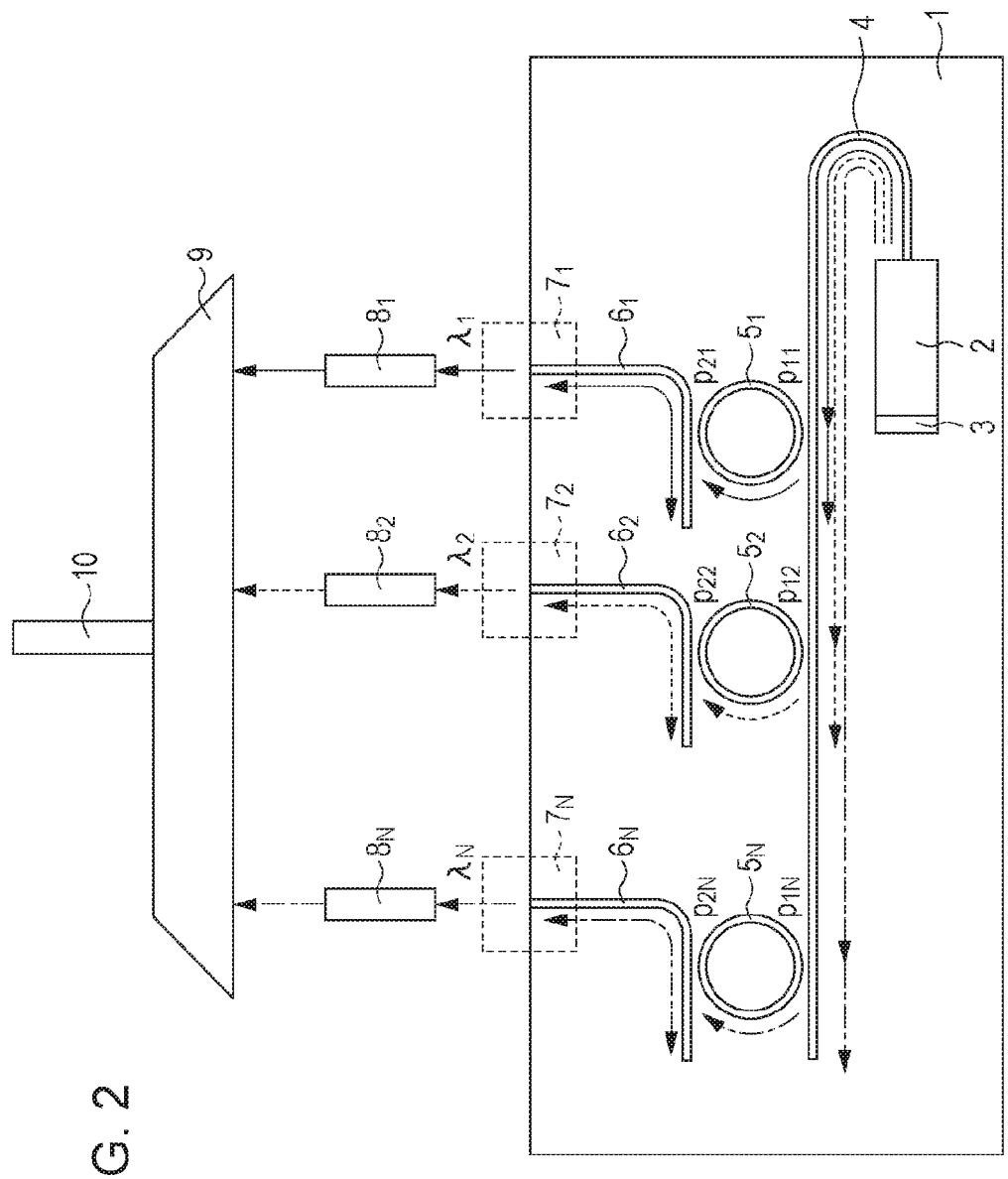
FIG. 2 is an outline configuration diagram of a wavelength multiplexing communication system according to the implementation of the present disclosure.

FIG. 2 is an outline configuration diagram of a wavelength multiplexing communication system according to the implementation of the present disclosure. In order to construct a wavelength multiplexing communication system by using the multi-wavelength light source illustrated in FIG. 1, an optical multiplexer 9 may be connected to the emitting end side of the multi-wavelength laser and an optical fiber 10 may be connected to the emitting end of the optical multiplexer 9.

Note that any number of wavelengths may be used in communication and, for example, an application with a four-wavelength configuration may be considered. That is, under the present circumstances, 100 Gigabit Ethernet™ in which 25 gigabits/s is allocated to each of four optical transmission modules having different wavelengths has been proposed. When four wavelengths are used, the present disclosure may be applied to 100 Gigabit Ethernet™.

According to the implementation of the present disclosure, laser light split on a wavelength basis by the ring resonator $5_1$ to $5_N$, which is for selecting separate wavelengths, are output from respective separate output waveguides, and thus the laser light has already been split on a wavelength basis before being output from the laser light source. Therefore, an optical splitter for splitting laser light into modulators for respective wavelengths on a wavelength basis may be reduced. As a result, the number of components of a system may be reduced even when a multi-wavelength laser light source is used in a wavelength multiplexing communication system, and a wavelength multiplexing communication system may be constructed with a simple configuration.

Figure 3:
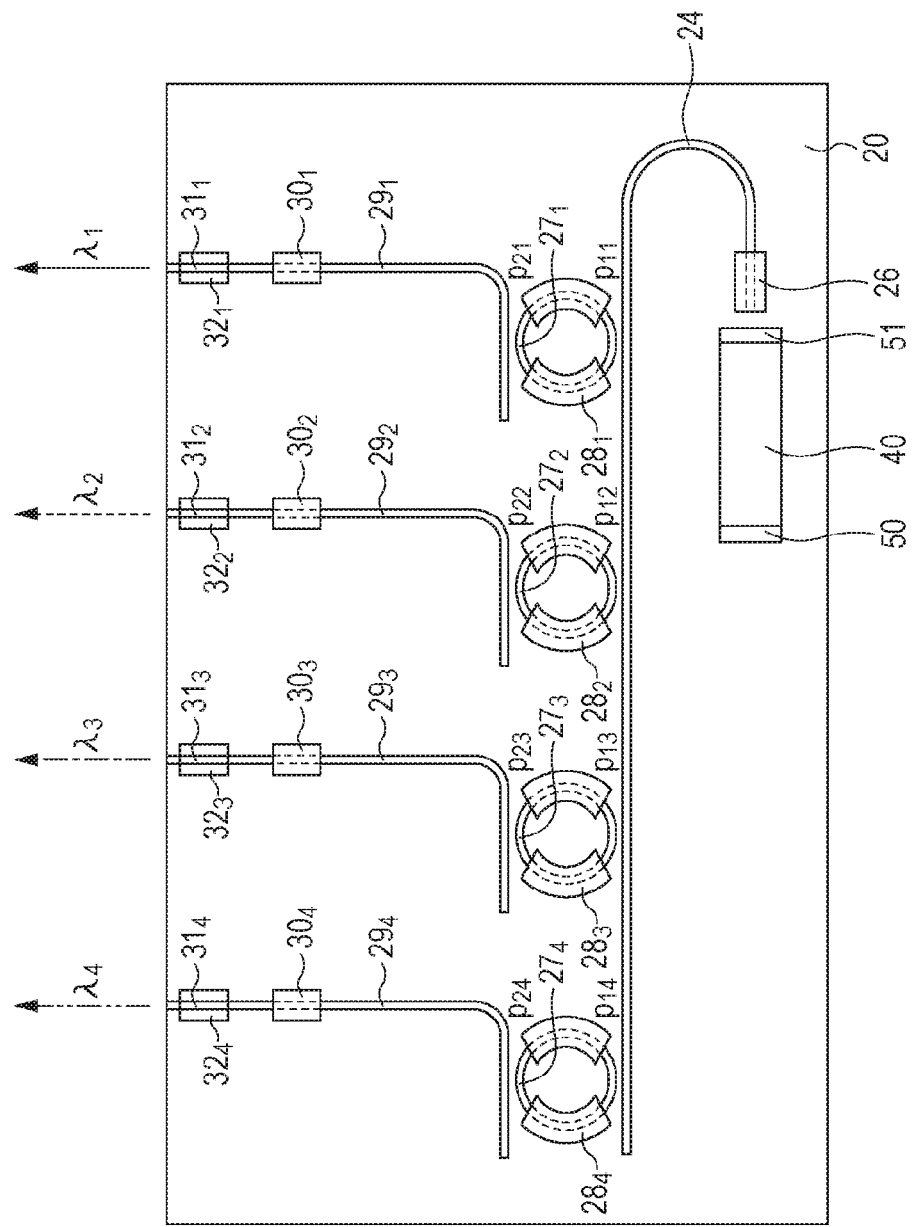
FIG. 3 is an outline configuration diagram of a multi-wavelength laser light source of a first embodiment.

Next, a multi-wavelength laser light source of a first embodiment will be described with reference to FIGS. 3 to 6. FIG. 3 is an outline configuration diagram of the multi-wavelength laser light source of the first embodiment. The multi-wavelength laser light source of the first embodiment is configured such that a semiconductor optical amplifier 40 that is a gain medium is provided on an Si waveguide wavelength filter including ring resonators $27_1$ to $27_4$. The Si waveguide wavelength filter includes an optical waveguide 24 connected to a semiconductor optical amplifier 40, and four ring resonators $27_1$ to $27_4$ whose input ports $p_{11}$ to $p_{14}$ are connected to the optical waveguide 24. Four output waveguides $29_1$ to $29_4$ are connected to output port $p_{21}$ to $p_{24}$ of the four ring resonators $27_1$ to $27_4$, respectively. Further, output waveguides $29_1$ to $29_4$ are provided with respective distributed Bragg reflectors (DBRs) $31_1$ to $31_4$ in each of which periodical concave and convex features are formed on the surface of a core layer.

Further, an anti-reflective film 51 is provided on the emitting end face of the semiconductor optical amplifier 40, and a high reflective film 50 is provided on the rear end. The semiconductor optical amplifier 40 and the optical waveguide 24 are optically coupled via a gap of about a several microns by using a spot size convertor 26 that is provided to the tip end of the optical waveguide 24 and tapered off. A laser resonator is formed of the high reflective film 50 and the distributed Bragg reflectors $31_1$ to $31_4$.

The ring resonators $27_1$ to $27_4$ and the distributed Bragg reflectors $31_1$ to $31_4$ are provided with wavelength control heaters $28_1$ to $28_4$ and $32_1$ to $32_4$, respectively. The resonance wavelengths of the ring resonators $27_1$ to $27_4$ may be individually controlled by the heaters $28_1$ to $28_4$, respectively, and the resonance wavelengths of the distributed Bragg reflectors $31_1$ to $31_4$ may be individually controlled by the heaters $32_1$ to $32_4$, respectively. The output waveguides $29_1$ to $29_4$ are provided with heaters $30_1$ to $30_4$ for phase control, and an optical resonator length of the laser resonator formed of the high reflective film 50 and the distributed Bragg resonators $31_1$ to $31_4$ is controlled by the phase control heaters $30_1$ to $30_4$.

Figure 4:
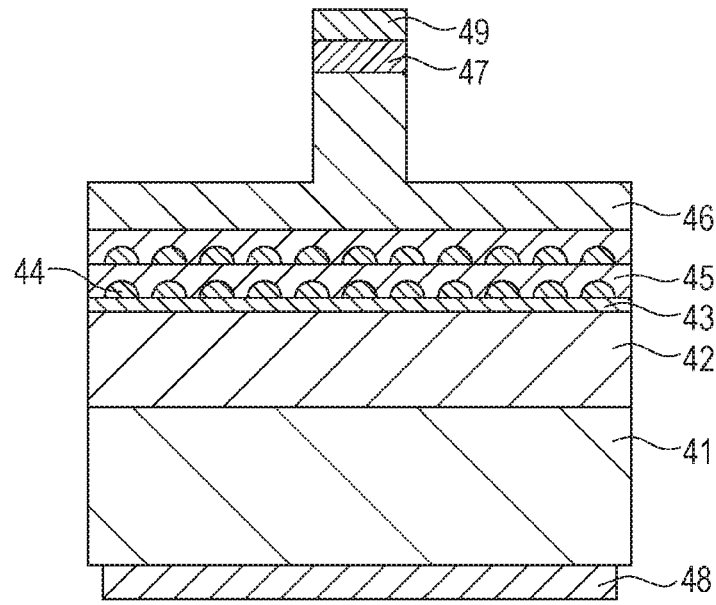
FIG. 4 is a sectional view of a semiconductor optical amplifier used in the multi-wavelength laser light source of the first embodiment.

FIG. 4 is a sectional view of a semiconductor optical amplifier used in the multi-wavelength laser light source of the first embodiment. In the semiconductor optical amplifier 40, a p-type AlGaAs clad layer 42 and an i-type GaAs ground layer 43 are sequentially deposited on a p-type GaAs substrate 41. Subsequently, InAs quantum dots 44 are formed by the Stranski-Krastanov growth mode, and these InAs quantum dots 44 are covered with an i-type GaAs intermediate layer 45. InAs quantum dots 44 are further formed on the i-type GaAs intermediate layer 45 as a ground layer. These processes are repeated to form an active layer including the quantum dots. At this time, due to variation in the size of the InAs quantum dots 44, the resultant multi-wavelength oscillation has the center wavelength near 1.30 μm.

Subsequently, an n-type InGaP clad layer 46 and an n-type GaAs contact layer 47 are grown, and a ridge is then formed by mesa etching so that the active layer is not reached. With such a ridge configuration, the active layer is not damaged. Subsequently, a p-side electrode 48 is formed on the backside of the p-type GaAs substrate, and an n-side electrode 49 is formed on the top face of the n-type GaAs contact layer 47. Note that, although not depicted, a high reflective film (50) is provided on one end face of the semiconductor optical amplifier 40 and an anti-reflective film (51) is provided on the other end.

Such an active layer having quantum dots generates a gain only at particular wavelengths at respective quantum dots in accordance with the size thereof, and quantum dots having a size that contributes to the laser oscillation at a particular wavelength are less likely to contribute to the laser oscillation at a different wavelength. Thus, there is an advantage that, when multi-wavelength laser oscillation occurs at one semiconductor optical amplifier having an active layer including quantum dots, stable laser oscillation is likely to be obtained independently at respective wavelengths.

Figure 5:
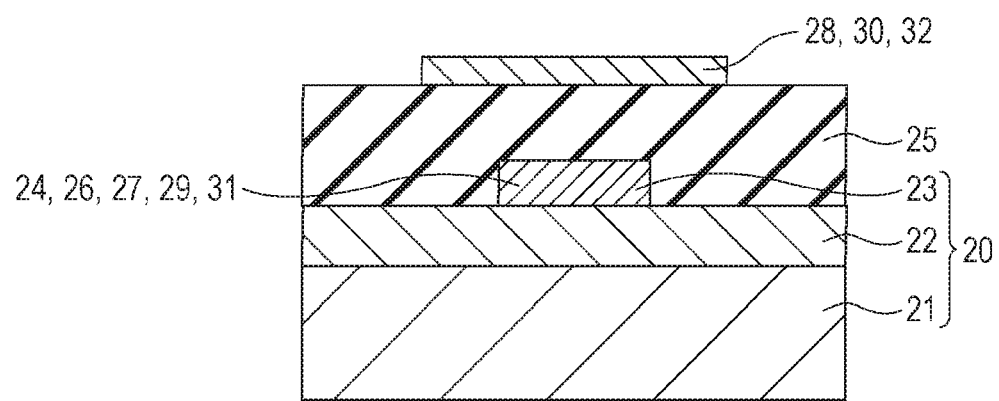
FIG. 5 is a sectional view of an optical waveguide used in the multi-wavelength laser light source of the first embodiment.

FIG. 5 is a sectional view of an optical waveguide used in the multi-wavelength laser light source of the first embodiment. First, an SOI substrate 20 is prepared that has a single-crystal silicon layer 23 with the thickness of 0.2 μm on a single-crystal silicon substrate 21 with a box layer 22 in between, the box layer 22 also serving as a lower clad layer. Subsequently, a resist pattern (not depicted) is formed by a predetermined photolithography process, and the single-crystal silicon layer 23 is etched to a width of 0.5 μm by using this resist pattern as a mask to form an optical waveguide 24 having a core layer with the thickness of 0.2 μm and the width of 0.5 μm. Note that the spot size converter 26 for expanding the mode diameter is provided to a portion where the optical waveguide 24 and the semiconductor optical amplifier 40 are coupled. The spot size converter 26 is formed such that the core width of the optical waveguide 24 gradually decreases tapering toward the semiconductor optical amplifier 40.

At this time, the ring resonators $27_1$ to $27_4$ and the output waveguides $29_1$ to $29_4$ are simultaneously formed. Each of the ring resonators $27_1$ to $27_4$ of this embodiment has the radius of curvature of 20 μm as a design value. Each of the ring resonators $27_1$ to $27_4$ has periodical resonance wavelengths that are determined by the circumferential length of a ring waveguide, and period (Free Spectrum Range (FSR)) thereof is around 5 nm when the radius of curvature is 20 μm. Subsequently, periodical concave and convex features are formed on the surface of a core layer on the output end side of the output waveguides $29_1$ to $29_4$ to form the distributed Bragg reflectors $31_1$ to $31_4$.

Subsequently, an $SiO_2$ film that also serves as a protective insulating film is deposited on the entire surface to form an $SiO_2$ upper clad layer 25. Subsequently, on the waveguides of the ring resonators $27_1$ to $27_4$, the separate heaters $28_1$ to $28_4$ are formed, respectively, to be able to shift the resonance wavelengths of the ring resonators $27_1$ to $27_4$. Note that, because a shift of around 1 nm is caused by a temperature change of 10 degrees Celsius, the temperature may be raised by 50 degrees Celsius in order to obtain a shift of 5 nm. Note that, although each of the heaters $28_1$ to $28_4$ is divided into the left and right sections to form a pair of heaters, any shape of a heater may be employed and, for example, may be formed of a horseshoe-shaped integrated structure.

Further, the phase control heaters $30_1$ to $30_4$ are provided on the middle portions of the waveguides of the output waveguides $29_1$ to $29_4$, and the heaters $32_1$ to $32_4$ that enable reflection wavelengths to be adjusted are provided on the distributed Bragg reflectors $31_1$ to $31_4$. Note that, while any material may be employed for the heaters $28_1$ to $28_4$ and $32_1$ to $32_4$ and the phase control heaters $30_1$ to $30_4$, Ti films are used in this embodiment.

Since such an Si waveguide using an Si core has a strong confinement of light and thus loss is less likely to be caused even when the radius of curvature is reduced in bending the Si waveguide, there is an advantage that a reduction in size including the size of the ring resonators is facilitated.

Next, the principle of wavelength selection in the multi-wavelength laser light source of the first embodiment will be described with reference to FIGS. 3 to 6. Among the light that is output from the semiconductor optical amplifier 40, travel in the optical waveguide 24, and enter the input port $p_H$ of the first ring resonator $27_1$, light which matches the resonance wavelength of the first ring resonator $27_1$ travels on the output port $p_{21}$ side and then toward the first output waveguide $29_1$.

The heater $32_1$ is formed on the first distributed Bragg reflector $31_1$ formed on the first output waveguide $29_1$, and the reflection wavelength is adjusted such that one of the resonance wavelengths passing through the first ring resonator $27_1$ is selectively reflected by the temperature control by using the heater $32_1$. The length or the like of the first distributed Bragg reflector $31_1$ is adjusted so that the reflectivity becomes around 30%.

The light reflected by the first distributed Bragg reflector $31_1$ returns to the semiconductor optical amplifier 40 along the path where the light has traveled, and is reflected by the high reflective film 50 provided on the rear end face of the semiconductor optical amplifier 40, and thereby a resonance occurs. Therefore, as illustrated in the top graph of FIG. 6, the laser oscillation occurs at the first wavelength $\lambda_1$ selected by the first ring resonator $27_1$ and the first distributed Bragg reflector $31_1$. The output of the laser light of the first wavelength $\lambda_1$ is extracted as a transmission light of the first distributed Bragg reflector $31_1$ and output to the outside of the Si waveguide wavelength filter.

The first phase control heater $30_1$ is formed on the waveguide of the first output waveguide $29_1$. The longitudinal mode position of the laser resonator that is formed of the first distributed Bragg reflector $31_1$ and the high reflective film 50 provided on the rear end face of the semiconductor optical amplifier 40 is adjusted by using the first phase control heater $30_1$ so as to match the center of the wavelength $\lambda_1$ selected as described above. Since the first phase control heater $30_1$ is able to control only the phase of the first output waveguide $29_1$, the light of the first wavelength $\lambda_1$ only may be phase-controlled independently.

Among the light that enter the port $p_{11}$ of the first ring resonator $27_1$, light which does not match the resonance wavelength does not travel toward the output port $p_{21}$ of the first ring resonator $27_1$ and further travels in the optical waveguide 24 to reach the input port $p_{12}$ of the second ring resonator $27_2$. In the second ring resonator $27_2$, a resonance wavelength position is adjusted by using the second heater $28_2$ such that the resonance wavelength is shifted to the short wavelength side by, for example, 1.25 nm, which is a quarter of the FSR, with respect to the resonance wavelength of the first ring resonator $27_1$.

Among the light that are not selected by the first ring resonator $27_1$ and reach the second ring resonator $27_2$, light whose wavelength matches the resonance wavelength of the second ring resonator $27_2$ travels to the output port $p_{22}$ side and then toward the second output waveguide $29_2$. The heater $32_2$ is formed on the second distributed Bragg reflector $31_2$ formed on the second output waveguide $29_2$, and the reflection wavelength is adjusted such that light with one of the resonance wavelengths passing via the second ring resonator $27_2$ is selectively reflected. The length or the like of the second distributed Bragg reflector $31_2$ is adjusted so that the reflectivity becomes around 30%.

The light reflected by the second distributed Bragg reflector $31_2$ returns to the semiconductor optical amplifier 40 along the path where the light has traveled, and is reflected by the high reflective film 50 provided on the rear end face of the semiconductor optical amplifier 40, and thereby a resonance occurs. Therefore, as illustrated in the second graph of FIG. 6, the laser oscillation occurs at the second wavelength $\lambda_2$ selected by the second ring resonator $27_2$ and the second distributed Bragg reflector $31_2$. The output of the laser light of the second wavelength $\lambda_2$ is extracted as transmission light of the second distributed Bragg reflector $31_2$ and output to the outside of the Si waveguide wavelength filter from a position that is different from the position for the laser light of the first wavelength $\lambda_1$.

The second phase control heater $30_2$ is formed on the waveguide of the second output waveguide $29_2$. The longitudinal mode position of the laser resonator that is formed of the second distributed Bragg reflector $31_2$ and the high reflective film 50 provided on the rear end face of the semiconductor optical amplifier 40 is adjusted by using the second phase control heater $30_2$ so as to match the center of the wavelength $\lambda_2$ selected as described above. Since the second phase control heater $30_2$ is able to control only the phase of the second output waveguide $29_2$, the light of the second wavelength $\lambda_2$ only may be phase-controlled independently.

Among the light that enter the port $p_{12}$ of the second ring resonator $27_2$, light which does not match the resonance wavelength does not travel toward the output port $p_{22}$ of the second ring resonator $27_2$ and further travels in the optical waveguide 24 to reach the input port $p_{13}$ of the third ring resonator $27_3$. In the third ring resonator $27_3$, the resonance wavelength position is adjusted by using the third heater $28_3$ such that the resonance wavelength is shifted to the short wavelength side by, for example, 2.5 nm, which is a half of the FSR, with respect to the resonance wavelength of the first ring resonator $27_1$.

Among the light that are not selected by the first ring resonator $27_1$ and the second ring resonator $27_2$ and reach the third ring resonator $27_3$, light whose wavelength matches the resonance wavelength of the third ring resonator $27_3$ travels to the output port $p_{23}$ side and then toward the third output waveguide $29_3$. The heater $32_3$ is formed on the third distributed Bragg reflector $31_3$ formed on the third output waveguide $29_3$, and the reflection wavelength is adjusted such that light with one of the resonance wavelengths passing via the third ring resonator $27_3$ is selectively reflected. The length or the like of the third distributed Bragg reflector $31_3$ is adjusted so that the reflectivity becomes around 30%.

The light reflected by the third distributed Bragg reflector $31_3$ returns to the semiconductor optical amplifier 40 along the path where the light has traveled, and is reflected by the high reflective film 50 provided on the rear end face of the semiconductor optical amplifier 40, and thereby a resonance occurs. Therefore, as illustrated in the third graph of FIG. 6, the laser oscillation occurs at the third wavelength $\lambda_3$ selected by the third ring resonator $27_3$ and the third distributed Bragg reflector $31_3$. The output of the laser of the third wavelength $\lambda_3$ is extracted as transmission light of the third distributed Bragg reflector $31_3$ and output to the outside of the Si waveguide wavelength filter from a position that is different from the positions for the laser light of the first wavelength $\lambda_1$ and the second wavelength $\lambda_2$.

The third phase control heater $30_3$ is formed on the waveguide of the third output waveguide $29_3$. The longitudinal mode position of the laser resonator that is formed of the third distributed Bragg reflector $31_3$ and the high reflective film 50 provided on the rear end face of the semiconductor optical amplifier 40 is adjusted by using the third phase control heater $30_3$ so as to match the center of the wavelength $\lambda_3$ selected as described above. Since the third phase control heater $30_3$ is able to control only the phase of the third output waveguide $29_3$, the light of the third wavelength $\lambda_3$ only may be phase-controlled independently.

Among the light that enter the port $p_{13}$ of the third ring resonator $27_3$, light which does not match the resonance wavelength does not travel toward the output port $p_{23}$ of the third ring resonator $27_3$ and further travels in the optical waveguide 24 to reach the input port $p_{14}$ of the fourth ring resonator $27_4$. In the fourth ring resonator $27_4$, the resonance wavelength position is adjusted by using the fourth heater $28_4$ such that the resonance wavelength is shifted to the short wavelength side by, for example, 3.75 nm, which is a three-quarter of the FSR, with respect to the resonance wavelength of the first ring resonator $27_1$.

Among the light that are not selected by the first ring resonator $27_1$ to the third ring resonator $27_3$ and reach the fourth ring resonator $27_4$, light whose wavelength matches the resonance wavelength of the fourth ring resonator $27_4$ travels to the output port $p_{24}$ side and then toward the fourth output waveguide $29_4$. The heater $32_4$ is formed on the fourth distributed Bragg reflector $31_4$ formed on the fourth output waveguide $29_4$, and the reflection wavelength is adjusted such that light with one of the resonance wavelengths passing via the fourth ring resonator $27_4$ is selectively reflected. The length or the like of the fourth distributed Bragg reflector $31_4$ is adjusted so that the reflectivity becomes around 30%.

The light reflected by the fourth distributed Bragg reflector $31_4$ returns to the semiconductor optical amplifier 40 along the path where the light has traveled, and is reflected by the high reflective film 50 provided on the rear endface of the semiconductor optical amplifier 40, and thereby a resonance occurs. Therefore, as illustrated in the bottom graph of FIG. 6, the laser oscillation occurs at the fourth wavelength $\lambda_4$ selected by the fourth ring resonator $27_4$ and the fourth distributed Bragg reflector $31_4$. The output of the laser light of the fourth wavelength $\lambda_4$ is extracted as transmission light of the fourth distributed Bragg reflector $31_4$ and output to the outside of the Si waveguide wavelength filter from a position that is different from the positions for the laser light of the first wavelength $\lambda_1$ to the third wavelength $\lambda_3$.

The fourth phase control heater $30_4$ is formed on the waveguide of the fourth output waveguide $29_4$. The longitudinal mode position of the laser resonator that is formed of the fourth distributed Bragg reflector $31_4$ and the high reflective film 50 provided on the rear end face of the semiconductor optical amplifier 40 is adjusted by using the fourth phase control heater $30_4$ so as to match the center of the wavelength $\lambda_4$ selected as described above. Since the fourth phase control heater $30_4$ is able to control only the phase of the fourth output waveguide $29_4$, the light of the fourth wavelength $\lambda_4$ only may be phase-controlled independently.

Figure 6:
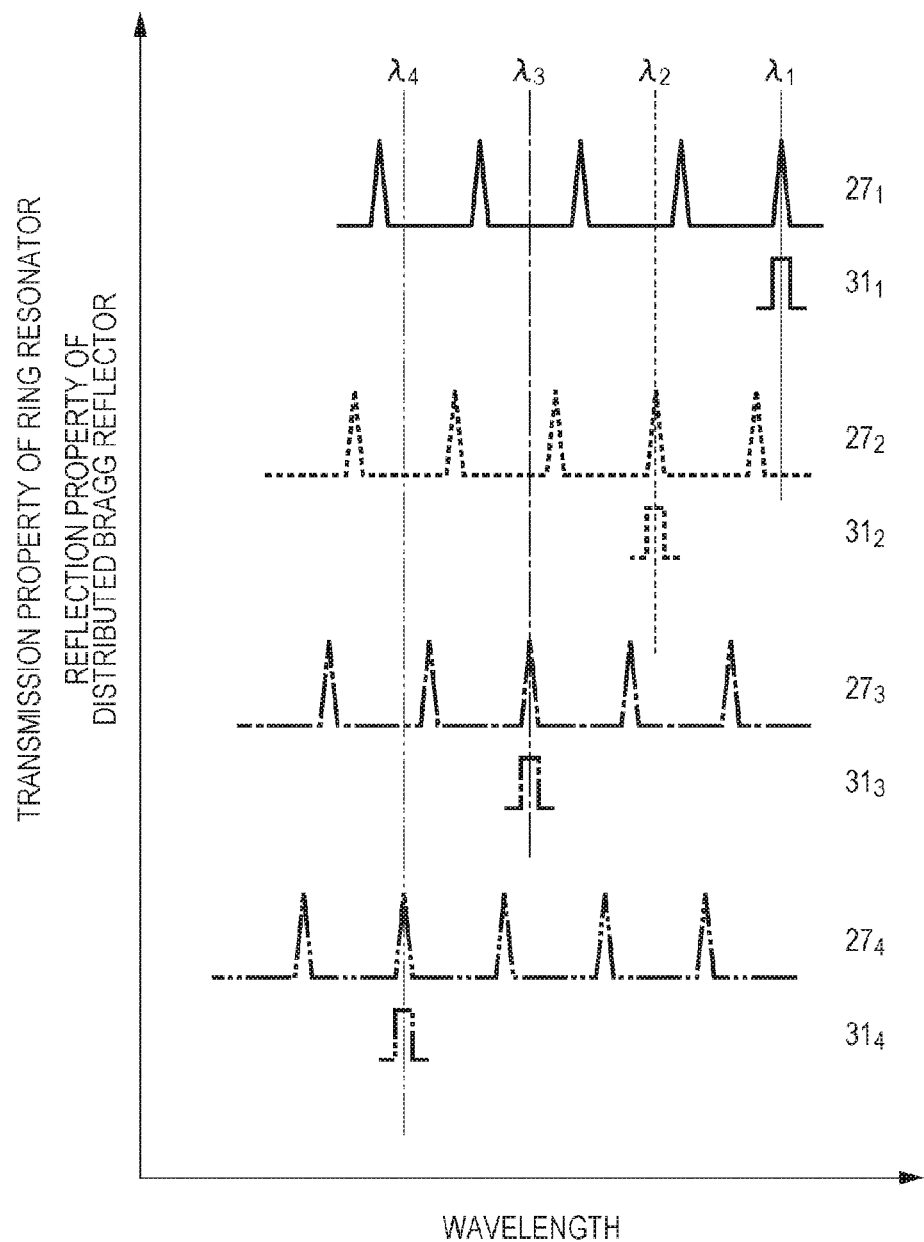
FIG. 6 is a graph illustrating a principle of wavelength selection in the multi-wavelength laser light source of the first embodiment.

Since each of the first wavelength $\lambda_1$ to the fourth wavelength $\lambda_4$ is one of the resonance wavelengths of the first ring resonator $27_1$ to the fourth ring resonator $27_4$ that are slightly shifted from each other, the resultant four wavelengths have different wavelengths, as illustrated in FIG. 6.

In this way, in the first embodiment, the laser light with four wavelengths is output from different positions via the first distributed Bragg reflector $31_1$ to the fourth distributed Bragg reflector $31_4$ from the first output waveguide $29_1$ to the fourth output waveguide $29_4$, respectively. Therefore, because light has been divided on a wavelength basis before being output from the multi-wavelength laser light source, an optical splitter may be unnecessary and thus the number of components may be reduced when the present laser is used in the wavelength multiplexing communication system.

Note that, although the wavelengths $\lambda_1$ to $\lambda_4$ are equally spaced in the case of FIG. 6, various combinations of wavelengths are possible without being limited to the illustrated example. The resonance wavelengths of the first ring resonator $27_1$ to the fourth ring resonator $27_4$ may not be preferably equally spaced as long as they are shifted from each other. Further, although FIG. 6 illustrates the example in which the reflection wavelengths of the first distributed Bragg reflector $31_1$ to the fourth distributed Bragg reflector $31_4$ are arranged shifted at an equal space by around the FSRs of the first ring resonator $27_1$ to the fourth ring resonator $27_4$, the embodiments are not limited thereto. For example, such a configuration is possible that the wavelengths $\lambda_1$ to $\lambda_4$ are not arranged in the illustrated order, or each of the reflection wavelengths of the first distributed Bragg reflector $31_1$ to the fourth distributed Bragg reflector $31_4$ matches any one of the resonance wavelengths of the first ring resonator $27_1$ to the fourth ring resonator $27_4$ which are out of the wavelength rage of FIG. 6. Further, although a quantum dot active layer formed on a GaAs substrate is employed as a gain medium in the present embodiment, without being limited thereto, a quantum dot active layer formed on an InP substrate may be employed. Further, without being limited to the use of quantum dots as an active layer, use of multi-quantum well structure or the like will result in the same effect. However, the separate laser oscillation is more likely to be obtained among different wavelengths by using a quantum dot active layer.

Next, a second embodiment will be described with reference to FIGS. 7 and 8. The fundamental configuration is similar to that of the first embodiment described above except that a ring resonator is provided instead of the distributed Bragg reflectors as a wavelength selector on the optical waveguide 24 side and that an end face mirror is used as the second reflective mirror.

Figure 7:
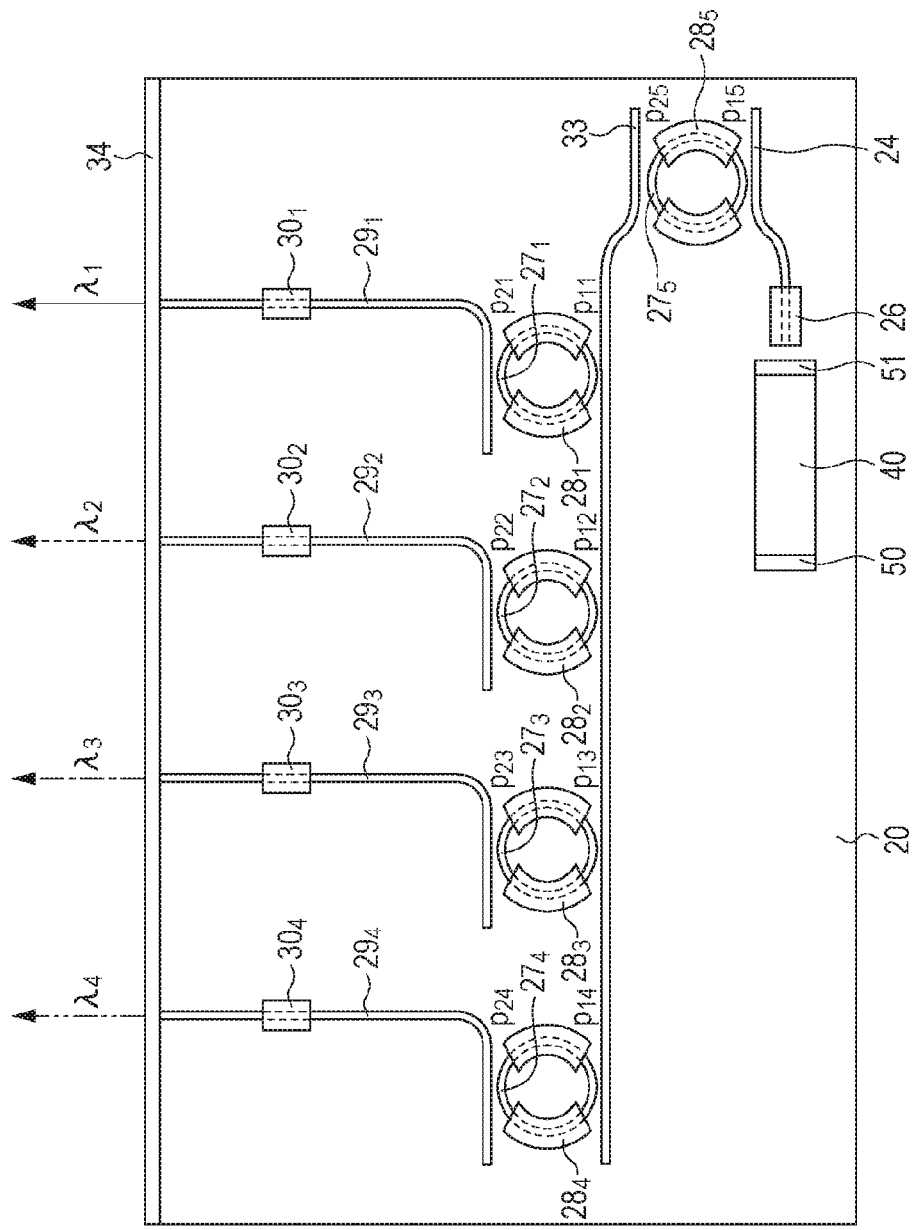
FIG. 7 is an outline configuration diagram of a multi-wavelength laser light source of a second embodiment.

FIG. 7 is an outline configuration diagram of a multi-wavelength laser light source of the second embodiment. The multi-wavelength laser light source of the second embodiment is configured such that the semiconductor optical amplifier 40 that is a gain medium is provided on the Si waveguide wavelength filter including the ring resonators $27_1$ to $27_4$. In the Si waveguide wavelength filter in the second embodiment, the optical waveguide connected to the semiconductor optical amplifier 40 is divided into the optical waveguide 24 and an optical waveguide 33, and the optical waveguide 24 and the optical waveguide 33 are optically coupled by a fifth ring resonator $27_5$. Further, a fifth heater $28_5$ for controlling the position of the resonance wavelength of the fifth ring resonator $27_5$ is provided on the waveguide of the fifth ring resonator $27_5$.

The divided optical waveguide 33 is coupled with four ring resonators $27_1$ to $27_4$ to which respective input ports $p_{11}$ to $p_{14}$ are connected. The output ports $p_{21}$ to $p_{24}$ of the four ring resonators $27_1$ to $27_4$ are connected to four output waveguides $29_1$ to $29_4$, respectively. Further, a reflective film 34 is provided on the emitting end face of the output waveguides $29_1$ to $29_4$. Further, the anti-reflective film 51 is provided on the emitting end face of the semiconductor optical amplifier 40, and the high reflective film 50 is provided on the rear end. A laser resonator of the semiconductor optical amplifier 40 is formed of the high reflective film 50 and the reflective film 34. Note that, when the reflective film 34 is formed of a laminated film such as a two-layer structure film, a good reflective property is provided for wavelengths ranging approximately from 1530 nm to 1570 nm, and thus such the reflective film 34 may be a reflective film for all the wavelengths of $\lambda_1$ to $\lambda_4$.

The ring resonators $27_1$ to $27_4$ are provided with the wavelength control heaters $28_1$ to $28_4$, respectively, also in this embodiment. The heaters $28_1$ to $28_4$ are adjusted such that resonance peaks of the respective ring resonators $27_1$ to $27_4$ match different resonance wavelengths of the fifth ring resonator $27_5$. Further, the output waveguides $29_1$ to $29_4$ are provided with the phase control heaters $30_1$ to $30_4$, and the optical resonator length of the laser resonator formed of the high reflective film 50 and the reflective film 34 is controlled by the phase control heaters $30_1$ to $30_4$.

Next, the principle of wavelength selection in the multi-wavelength laser light source of the second embodiment will be described with reference to FIGS. 7 and 8. In the case of the second embodiment, the first ring resonator $27_1$ to the fourth ring resonator $27_4$ and the fifth ring resonator $27_5$ provided on the optical waveguides 24 and 33 side are combined to select wavelengths by using the Vernier effect.

Figure 8:
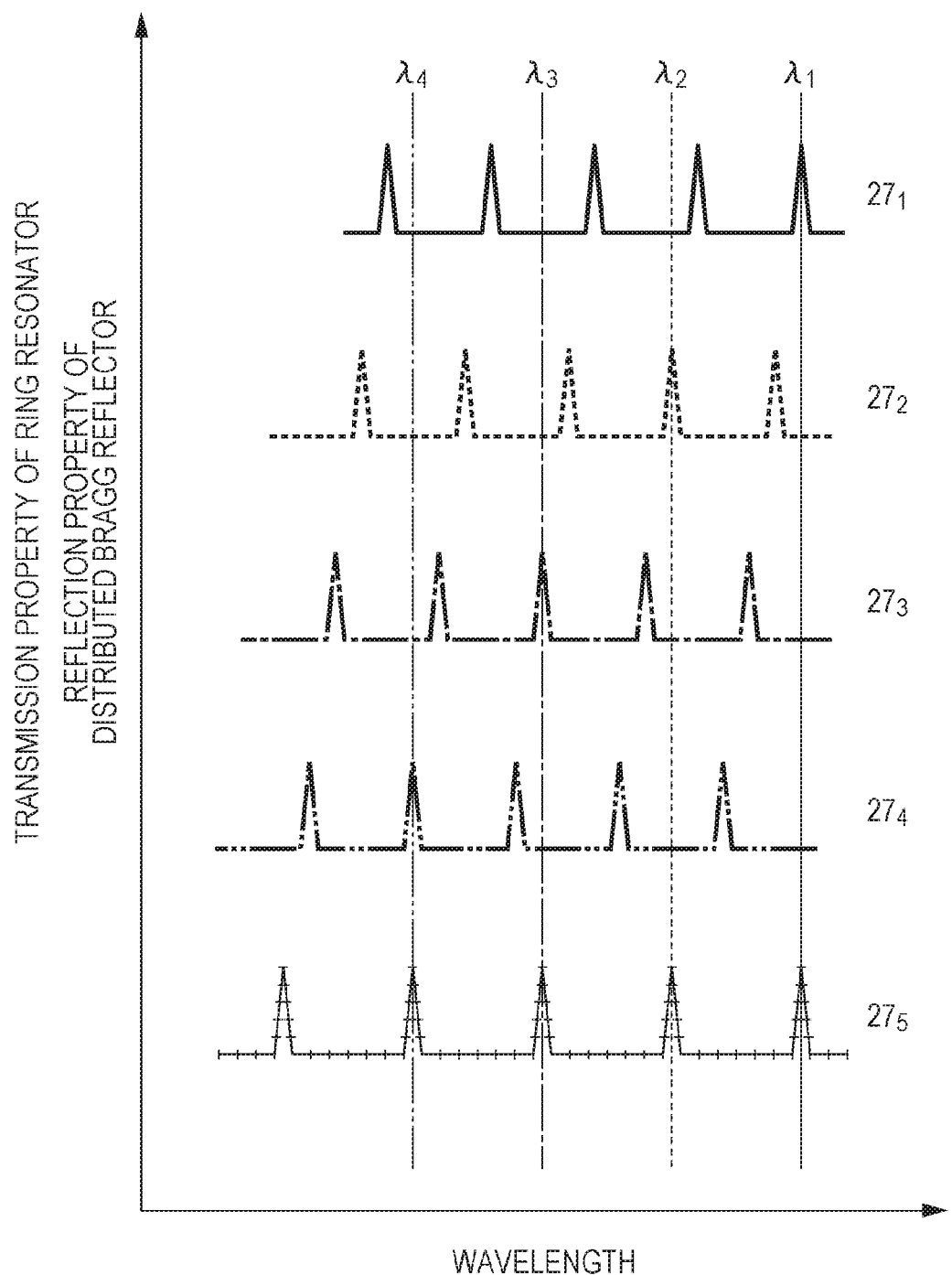
FIG. 8 is a graph illustrating a principle of wavelength selection in the multi-wavelength laser light source of the second embodiment.

That is, as indicated by the rightmost line in FIG. 8, the first wavelength $\lambda_1$ is a wavelength at which one of the resonance wavelengths of the first ring resonator $27_1$ matches that of the fifth ring resonator $27_5$. Further, as indicated by the second right line in FIG. 8, the second wavelength $\lambda_2$ is a wavelength at which one of the resonance wavelengths of the second ring resonator $27_2$ matches that of the fifth ring resonator $27_5$. Further, as indicated by the third right line in FIG. 8, the third wavelength $\lambda_3$ is a wavelength at which one of the resonance wavelengths of the third ring resonator $27_3$ matches that of the fifth ring resonator $27_5$. Furthermore, as indicated by the leftmost line in FIG. 8, the fourth wavelength $\lambda_4$ is a wavelength at which one of the resonance wavelengths of the fourth ring resonator $27_4$ matches that of the fifth ring resonator $27_5$.

In the second embodiment, since the wavelengths of $\lambda_1$ to $\lambda_4$ may be changed by using the Vernier effect, the wavelengths may be changed in a wider range than in the case where the reflection wavelengths of the distributed Bragg reflectors $31_1$ to $31_4$ are changed as seen in the first embodiment. Further, by matching the resonance wavelength of the fifth ring resonator $27_5$ to a wavelength grid of the wavelength multiplexing communication, automatic oscillation at the wavelength grid becomes possible for all the wavelengths. Note that, since wave-guiding operation of each wavelength laser light is similar to that in the first embodiment, description thereof will be omitted.

Further, in the second embodiment, because light has already been split on a wavelength basis before being output from the multi-wavelength laser light source in a similar manner to the first embodiment, an optical splitter for splitting laser light may be reduced and therefore a system with a simple configuration is constructed.

Next, a third embodiment will be described with reference to FIGS. 9 and 10. In the multi-wavelength laser light source of the third embodiment, optical modulators are integrated on the output end side of the output waveguides of the multi-wavelength laser light source of the first embodiment, and other configurations are similar to those of the first embodiment described above.

Figure 9:
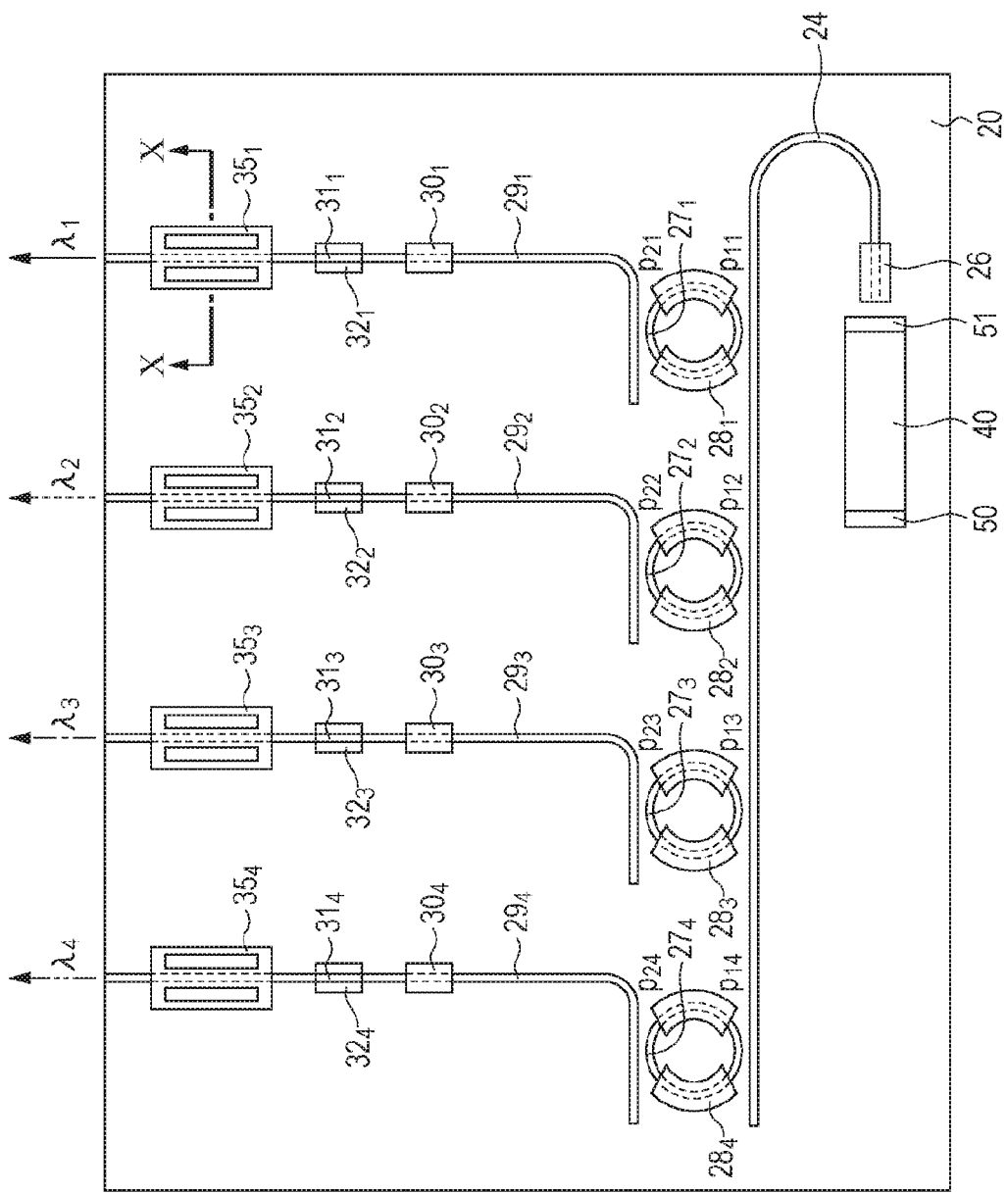
FIG. 9 is an outline configuration diagram of a multi-wavelength laser light source of a third embodiment.

FIG. 9 is an outline configuration diagram of the multi-wavelength laser light source of the third embodiment in which optical modulators $35_1$ to $35_4$ are integrated in a monolithic manner on the output end side of the output waveguides $29_1$ to $29_4$ of the multi-wavelength laser light of the first embodiment described above.

Figure 10:
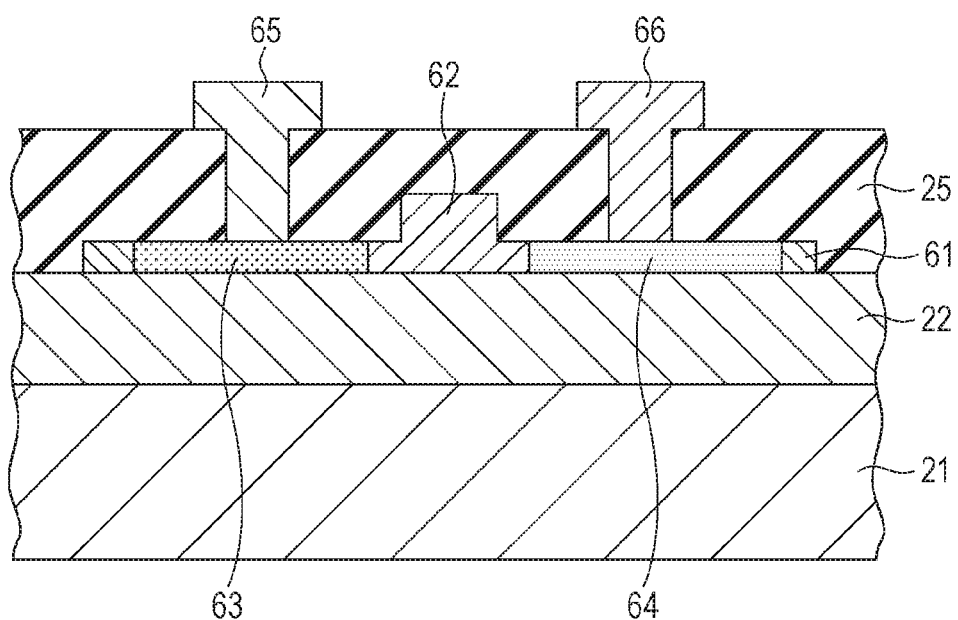
FIG. 10 is a sectional view of an optical modulator used in the multi-wavelength laser light source of the third embodiment.

FIG. 10 is a sectional view of the optical modulator used in the multi-wavelength laser light source of the third embodiment. In this embodiment, the optical modulators $35_1$ to $35_4$ are formed by silicon photonics to process a single-crystal silicon layer (23) of an SOI substrate (20) that forms the Si waveguide wavelength filter. That is, a single-crystal silicon layer (23) provided on a BOX layer 22 is processed to form a rib waveguide having a slab portion 61 and a rib portion 62 and, interposing the rib portion 62, one of the regions of the slab portion 61 is doped with P to form an n-side region 63 and the other region is doped with B to form a p-side region 64.

Subsequently, the $SiO_2$ upper clad layer 25 that serves as a protective insulating film is formed, and contact holes reaching the n-side region 63 and the p-side region 64 are then formed. Electro-conductive material is embedded in these contact holes to form an n-side electrode 65 and a p-side electrode 66 and thereby the optical modulator 35 is completed.

A forward bias is applied to this pin-structured optical modulator 35 to inject carriers into the rib portion 62 and thereby optical modulation is enabled. Note that the n-side region 63 and the p-side region 64 may be formed so as to reach the rib portion 62 to form p-n structure and a reverse bias may be applied to draw carriers out and perform optical modulation.

In the third embodiment, silicon photonics is utilized to integrate the optical modulators in the Si waveguide wavelength filter in a monolithic manner and therefore a wavelength multiplexing communication system is constructed with a simpler, more compact configuration.

Next, a multi-wavelength laser light source of a fourth embodiment will be described with reference to FIG. 11. In the multi-wavelength laser light source of the fourth embodiment, the optical modulators of the multi-wavelength laser light source in the third embodiment described above are replaced with Mach-Zehnder optical modulators, and other configurations are similar to those of the third embodiment described above.

Figure 11:
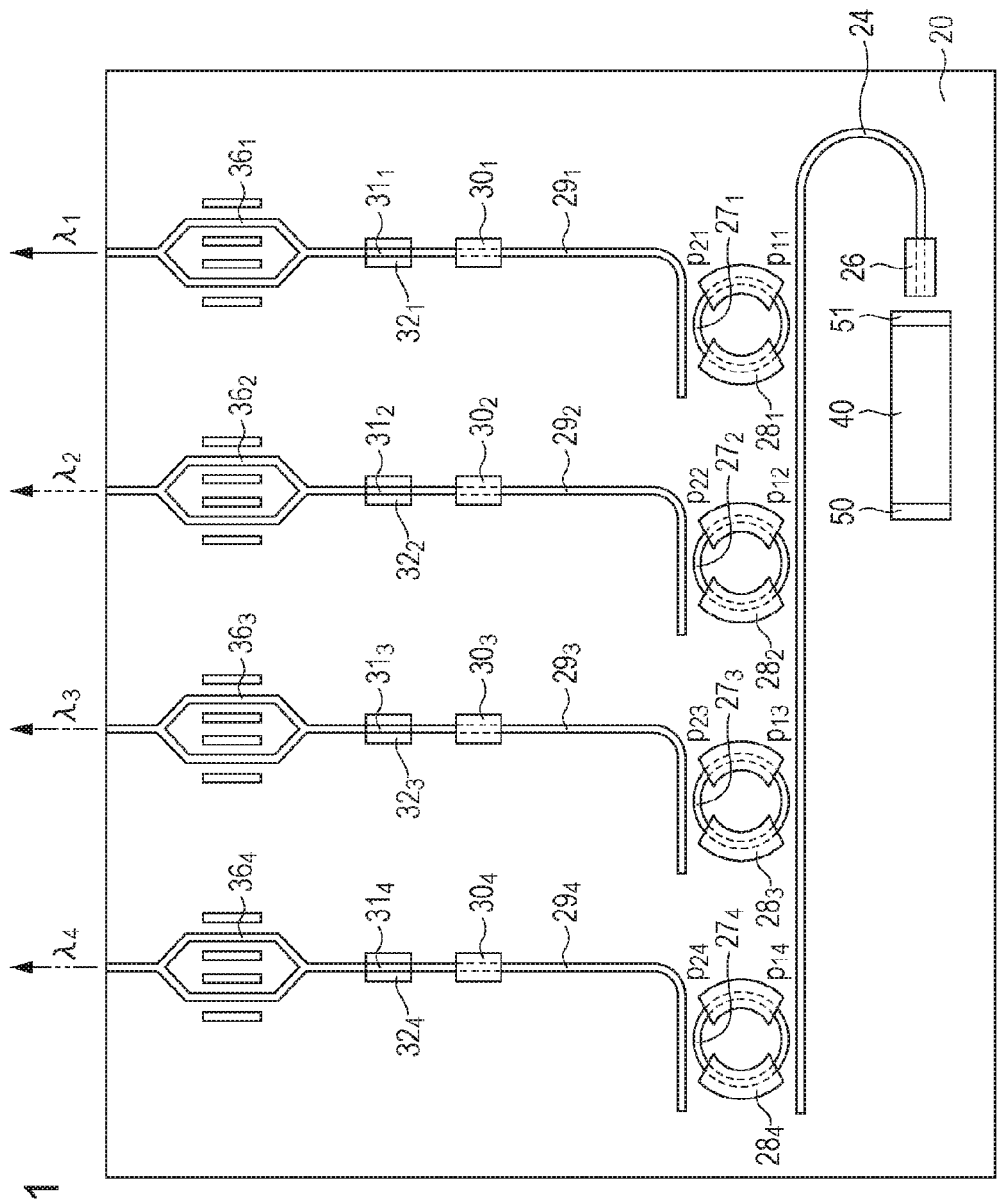
FIG. 11 is an outline configuration diagram of a multi-wavelength laser light source of a fourth embodiment.

FIG. 11 is an outline configuration diagram of the multi-wavelength laser light source of the fourth embodiment in which Mach-Zehnder optical modulators $36_1$ to $36_4$ are integrated in a monolithic manner on the output end side of the output waveguides $29_1$ to $29_4$ of the multi-wavelength laser light source of the first embodiment described above.

In this case, similarly to the third embodiment, the Mach-Zehnder optical modulators $36_1$ to $36_4$ are formed by silicon photonics to process a single-crystal silicon layer (23) of an SOI substrate (20) that forms the Si waveguide wavelength filter. That is, the single-crystal silicon layer (23) provided on the BOX layer 22 is processed to form a pair of branching waveguides that are rib-structured waveguides and two arm waveguides that are interposed between the pair of branching waveguides. A pair of n-side region and p-side region is formed in a slab portion of each of the arm waveguides, and an n-side electrode and a p-side electrode are then formed.

A voltage is applied to each of the arm waveguides to control the phase of laser light traveling in each of the arm waveguides. When both phases of the arm waveguides match each other, an ON state is established and a pulse signal is output and, when the phases are shifted by π from each other, an OFF state is established and no pulse is output.

In the fourth embodiment, silicon photonics is utilized to integrate the Mach-Zehnder optical modulators in the Si waveguide wavelength filter in a monolithic manner. This allows for a reduction in size and a simpler implementation, and an advanced modulation system may be adapted by application of wavelength chirp control, a phase modulation system, or the like.

Next, a multi-wavelength laser light source of a fifth embodiment will be described with reference to FIG. 12. In the multi-wavelength laser light source of the fifth embodiment, the optical modulators are integrated on the output end side of the output waveguides of the multi-wavelength laser light source of the second embodiment, and other configurations are similar to those of the second embodiment described above.

Figure 12:
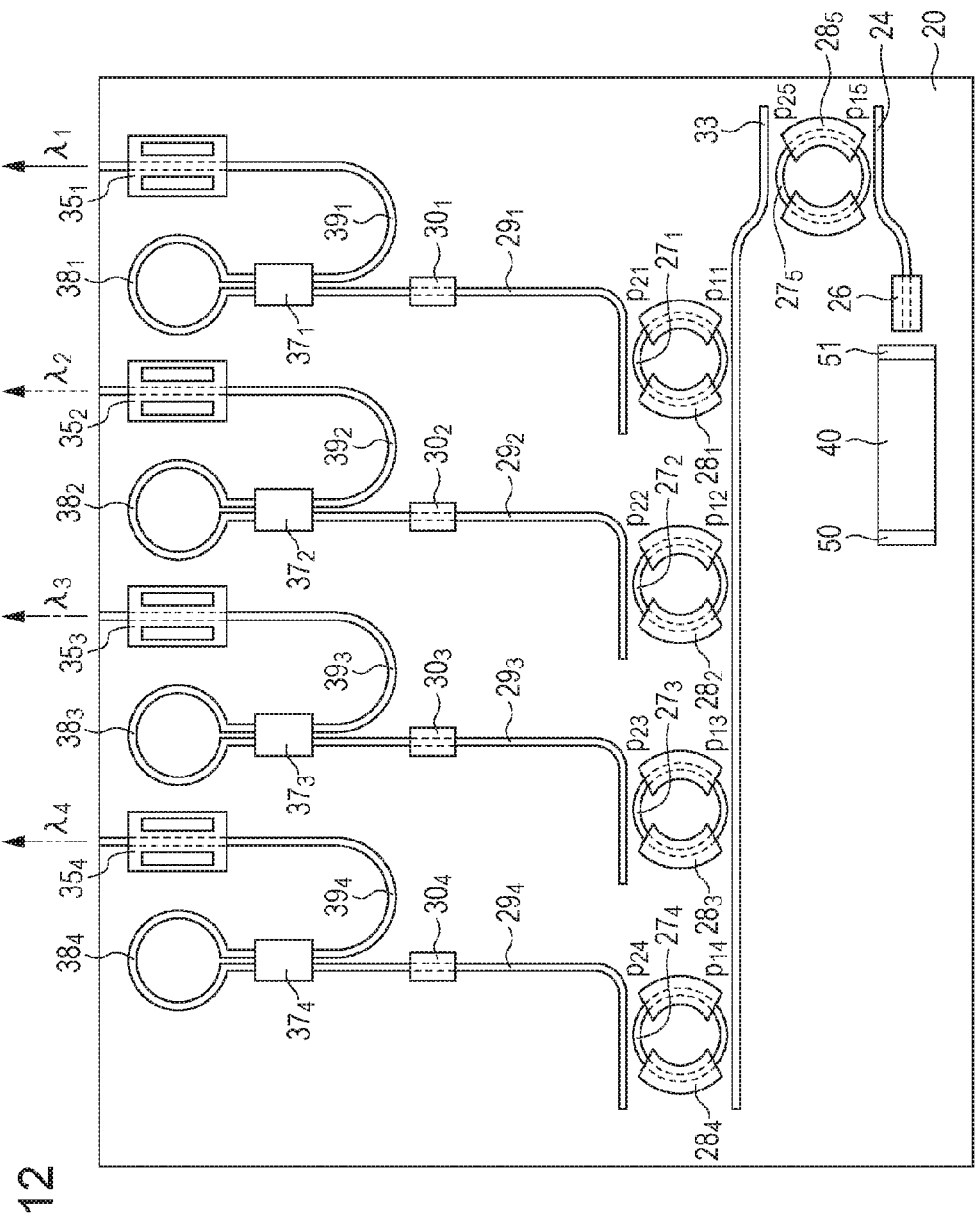
FIG. 12 is an outline configuration diagram of a multi-wavelength laser light source of a fifth embodiment.
Figure 13:
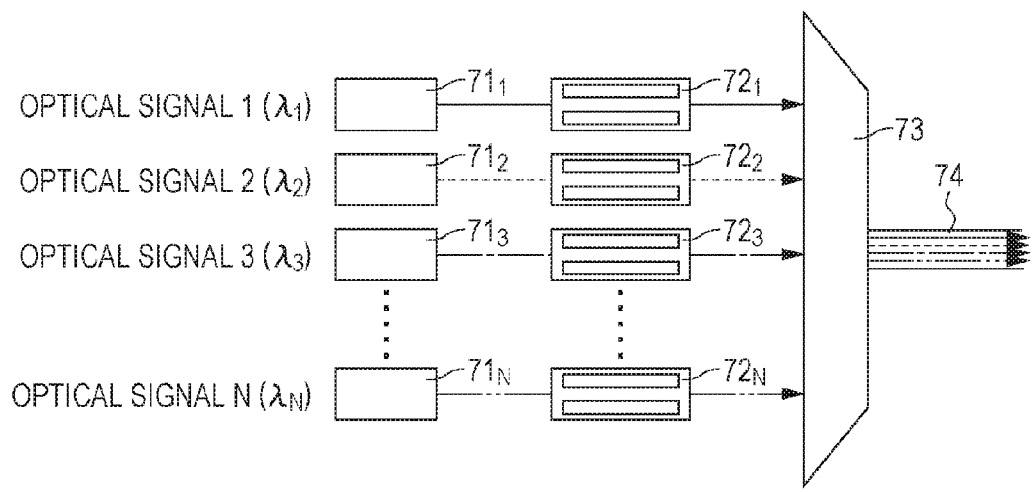
FIG. 13 is an outline configuration diagram of a conventional wavelength multiplexing communication system.
Figure 14:
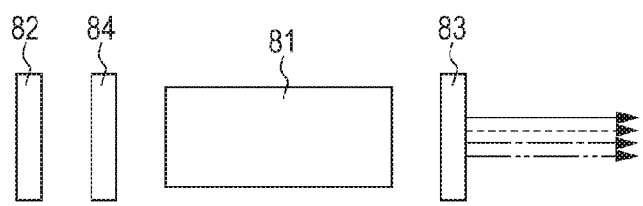
FIG. 14 is an explanatory diagram of an example of a conventional multi-wavelength laser light source.
Figure 15:
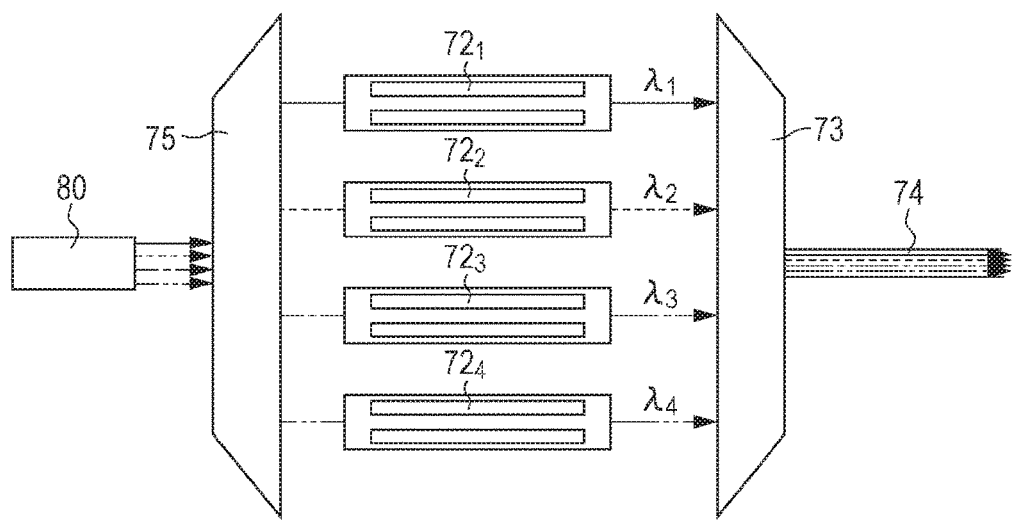
FIG. 15 is an outline configuration diagram of a wavelength multiplexing communication system that is usually employed when a multi-wavelength laser light source is used.

FIG. 12 is an outline configuration diagram of the multi-wavelength laser light source of the fifth embodiment in which the optical modulators $35_1$ to $35_4$ are integrated in a monolithic manner on the output end side of the output waveguides $29_1$ to $29_4$ of the multi-wavelength laser light source of the second embodiment described above. In order to connect optical modulators $35_1$ to $35_4$, however, loop mirrors $38_1$ to $38_4$ have to be prepared and connected to the output waveguides $29_1$ to $29_4$, and directional couplers $37_1$ to $37_4$ are provided for outputs to branching waveguides $39_1$ to $39_4$. The optical modulators $35_1$ to $35_4$ are connected to these branching waveguides $39_1$ to $39_4$. By changing the number of coupled directional couplers $37_1$ to $37_4$, it is possible to change the ratio of the light extracted to the modulator side to the light returning from the loop mirrors $38_1$ to $38_4$. Note that multimode interference waveguides may be used instead of the directional couplers $37_1$ to $37_4$ and, in this case, the ratio of the light extracted to the modulator side is limited to a particular ratio, such as 1:1.

Also in this case, the directional couplers $37_1$ to $37_4$, the loop mirrors $38_1$ to $38_4$, the branching waveguides $39_1$ to $39_4$, and the optical modulators $35_1$ to $35_4$ are integrated in a monolithic manner on an SOI substrate by silicon photonics. Note that, in this case, the reflection film 34 of the second embodiment may be reduced.

Also in the fifth embodiment, silicon photonics is utilized to integrate the optical modulator in the Si waveguide wavelength filter in a monolithic manner and therefore a wavelength multiplexing communication system is constructed with a simpler, more compact configuration. Note that, also in the fifth embodiment, Mach-Zehnder optical modulators may be used as optical modulators in a similar manner to the fourth embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A multi-wavelength laser light source, comprising:
   a gain waveguide having a gain medium and a first mirror; and
   a waveguide wavelength filter, wherein
   the waveguide wavelength filter comprises:
      a first optical waveguide coupled to an end of the gain waveguide opposite to the first mirror,
      a plurality of ring resonators having input ports coupled to the first optical waveguide and having resonance wavelengths different from each other,
      a plurality of output waveguides coupled to respective output ports of the plurality of ring resonators, and
      second mirrors configured to correspondingly reflect, back to the plurality of ring resonators, at least part of light that has traveled via the output waveguides from the plurality of ring resonators.

2. The multi-wavelength laser light source according to claim 1, wherein
   each of the second mirror is a distributed Bragg reflector, and
   the distributed Bragg reflector includes a wavelength adjustment mechanism configured to adjust a reflection wavelength.

3. The multi-wavelength laser light source according to claim 1, wherein
   the first optical waveguide has a first sub-optical waveguide and a second sub-optical waveguide at least a part of which is arranged in parallel to the first sub-optical waveguide, and
   the first sub-optical waveguide and the second sub-optical waveguide are coupled by a wavelength selecting ring resonator.

4. The multi-wavelength laser light source according to claim 1, wherein the gain medium is a semiconductor optical amplifier.

5. The multi-wavelength laser light source according to claim 4, wherein the semiconductor optical amplifier has an active layer including quantum dots.

6. The multi-wavelength laser light source according to claim 1, wherein the waveguide wavelength filter is formed of a silicon optical waveguide.

7. The multi-wavelength laser light source according to claim 1, wherein each of the plurality of ring resonators has a wavelength control mechanism configured to change a resonance wavelength of the ring resonator.

8. The multi-wavelength laser light source according to claim 1, wherein the plurality of ring resonators have wavelength control mechanisms configured to control resonance wavelengths of the respective ring resonators such that the resonance wavelengths are different from each other.

9. The multi-wavelength laser light source according to claim 3, wherein
the wavelength selecting ring resonator has a wavelength control mechanism configured to change a resonance wavelength of the wavelength selecting ring resonator, and
each of the plurality of ring resonators has a wavelength control mechanism configured to change a resonance wavelength of the ring resonator.

10. The multi-wavelength laser light source according to claim 3, wherein
the wavelength selecting ring resonator has a wavelength control mechanism configured to control a resonance wavelength position of the wavelength selecting ring resonator, and
the plurality of ring resonators have wavelength control mechanisms configured to perform control such that resonance wavelength positions of the respective ring resonators match different resonance wavelengths of the wavelength selecting ring resonator.

11. The multi-wavelength laser light source according to claim 8, wherein the wavelength control mechanism includes a heater.

12. The multi-wavelength laser light source according to claim 1, wherein each of the output waveguides includes a phase controller.

13. The multi-wavelength laser light source according to claim 12, wherein the phase controller includes a heater provided on the output waveguide.

14. The multi-wavelength laser light source according to claim 1, wherein an optical modulator is connected to each of the output waveguides.

15. The multi-wavelength laser light source according to claim 14, wherein the optical modulator connected to each of the output waveguides is integrated in a monolithic manner with the waveguide wavelength filter.

16. The multi-wavelength laser light source according to claim 14, wherein the optical modulator is an electro absorption optical modulator or a Mach-Zehnder optical modulator.

17. The multi-wavelength laser light source according to claim 3, wherein
a first port of a coupler is coupled to each of the output waveguides,
a second port and a third port of the coupler coupled to a loop mirror, and
a fourth port of the coupler is coupled to an optical modulator.

18. A wavelength multiplexing communication system, comprising:
a multi-wavelength laser light source comprises:
a gain waveguide having a gain medium and a first mirror; and
a waveguide wavelength filter, wherein the waveguide wavelength filter comprises:
a first optical waveguide coupled to an end of the gain waveguide opposite to the first mirror,
a plurality of ring resonators having input ports coupled to the first optical waveguide and having resonance wavelengths different from each other,
a plurality of output waveguides coupled to respective output ports of the plurality of ring resonators, and
second mirrors configured to correspondingly reflect, back to the plurality of ring resonators, at least part of light that has traveled via the output waveguides from the plurality of ring resonators;
an optical multiplexer coupled to an emitting end side of the multi-wavelength laser light source; and
an optical fiber coupled to an emitting end of the optical multiplexer.

* * * * *